United States Patent
Matsumoto

(10) Patent No.: US 9,768,795 B1
(45) Date of Patent: Sep. 19, 2017

(54) SUCCESSIVE APPROXIMATION A/D CONVERTER

(71) Applicant: ROHM CO., LTD., Ukyo-Ku, Kyoto (JP)

(72) Inventor: Koichi Matsumoto, Kyoto (JP)

(73) Assignee: ROHM CO., LTD., Ukyo-Ku, Kyoto (JP)

( * ) Notice: Subject to any disclaimer, the term of this patent is extended or adjusted under 35 U.S.C. 154(b) by 0 days.

(21) Appl. No.: 15/485,893

(22) Filed: Apr. 12, 2017

(30) Foreign Application Priority Data

Apr. 15, 2016 (JP) ................. 2016-082073

(51) Int. Cl.
H03M 1/00 (2006.01)
H03M 1/46 (2006.01)
H03M 1/12 (2006.01)

(52) U.S. Cl.
CPC ......... H03M 1/468 (2013.01); H03M 1/1245 (2013.01)

(58) Field of Classification Search
CPC ............................ H03M 1/486; H03M 1/1245
USPC ................................................ 341/118–155
See application file for complete search history.

(56) References Cited

U.S. PATENT DOCUMENTS

| | | | | |
|---|---|---|---|---|
| 4,390,865 A * | 6/1983 | Lauro | ................... | G01D 5/243 318/660 |
| 6,809,674 B1 * | 10/2004 | Ramsden | ............ | H03M 1/1225 341/141 |
| 7,170,439 B1 * | 1/2007 | Chen | ................... | H03M 1/1009 341/118 |
| 8,344,925 B1 * | 1/2013 | Evans | ................... | H03M 1/462 341/118 |
| 8,508,398 B1 * | 8/2013 | Strode | ................. | H03M 1/0607 341/155 |
| 8,547,270 B1 * | 10/2013 | Strode | ................. | H03M 1/1061 341/155 |
| 8,957,802 B1 * | 2/2015 | Evans | ................. | H03M 1/0863 341/155 |
| 9,397,679 B1 * | 7/2016 | Harpe | ................. | H03M 1/1033 |
| 2007/0252747 A1 * | 11/2007 | Lyden | ................. | H03M 1/0641 341/161 |
| 2010/0182176 A1 * | 7/2010 | Kawahito | ............... | H03M 1/00 341/122 |
| 2010/0231154 A1 * | 9/2010 | Kamata | ................... | H02P 6/007 318/400.32 |
| 2011/0234433 A1 * | 9/2011 | Aruga | ................. | H01L 23/5223 341/172 |
| 2012/0146822 A1 * | 6/2012 | Kang | ..................... | H03M 1/08 341/110 |

FOREIGN PATENT DOCUMENTS

JP 2014138371 A 7/2014
JP 2014143639 A 8/2014

* cited by examiner

Primary Examiner — Lam T Mai
(74) Attorney, Agent, or Firm — Cantor Colburn LLP

(57) ABSTRACT

A first capacitor and a second capacitor are each arranged such that their first ends are coupled to a first node. A first switch is arranged between a second end of the first capacitor and a high voltage terminal. A second switch is arranged between the second end of the second capacitor and a low voltage terminal. A fifth switch is arranged between the second end of the first capacitor and a first input of a comparator. A sixth switch is arranged between the second end of the second capacitor and the first input of the comparator.

5 Claims, 5 Drawing Sheets

100R

SUCCESSIVE APPROXIMATION A/D CONVERTER

CROSS-REFERENCE TO RELATED APPLICATIONS

This application is based upon and claims the benefit of priority from the prior Japanese Patent Application No. 2016-082073, filed Apr. 15, 2016, the entire contents of which are incorporated herein by reference.

BACKGROUND OF THE INVENTION

1. Field of the Invention

The present invention relates to a successive approximation A/D converter.

2. Description of the Related Art

As an A/D converter having a medium resolution or high resolution (e.g., 8-bit resolution or more), a successive approximation A/D converter (SAR: Successive Approximation Register) is employed. FIG. 1 is a circuit diagram showing a successive approximation A/D converter 100R. The successive approximation A/D converter 100R includes a sample-and-hold circuit 102, a comparator 104, a logic circuit 106, and a D/A converter 108.

In a sampling phase $\phi 1$, the sample-and-hold circuit 102 instructs a sampling capacitor C1 to sample a voltage that corresponds to an input voltage $V_{IN}$. Subsequently, during a comparison phase $\phi 2$, the voltage thus sampled is held. The D/A converter 108 generates a threshold voltage $V_{TH}$ that corresponds to a given digital input $D_{TH}$. With an N-bit A/D converter, such an arrangement gives rise to a comparison operation being performed N times in the comparison phase $\phi 2$. The comparator 104 compares the voltage held by the sample-and-hold circuit 102 with the output voltage $V_{TH}$ of the D/A converter 108 every time the comparison operation is performed. In the first comparison phase $\phi 2$, the threshold voltage $V_{TH1}$ is applied to one end of the sampling capacitor C1, which changes the voltage across the first capacitor C1 to $(V_{IN}-V_{TH1})$. The comparator 104 compares the voltage $(V_{IN}-V_{TH1})$ across the first capacitor C1 with a reference voltage (0 V, in this example), so as to judge the magnitude relation between $V_{IN}$ an $V_{TH1}$.

The logic circuit 106 updates the digital input $D_{TH}$ to be used in the next comparison operation, based on the output of the comparator 104. By repeatedly performing such an operation, such an arrangement generates a digital value $D_{OUT}$ in the form of an N-bit quantized value.

With such a successive approximation A/D converter 100R, a bias power supply 112 is provided in order to set the voltage levels of the inverting input terminal and the non-inverting input terminal of the comparator 104 to optimum voltage levels (see Japanese Patent Application Laid Open No. 2014-138371).

In many cases, the bias power supply 112 is configured as a resistor voltage dividing circuit or a constant voltage source employing diodes or MOSFETs (Metal Oxide Semiconductor Field Effect Transistors), for example. Bias switches SW41 and SW42 are turned on during the sampling phase $\phi 1$. In this phase, the sampling capacitor C1 is charged using the voltage difference $(V_{IN}-V_{BIAS})$. Furthermore, a sampling capacitor C2 is charged using the voltage difference $-V_{BIAS}$. Thus, in the comparison phase, the input voltages of the comparator 104 are biased using the bias voltage $V_{BIAS}$.

As a result of investigating such a conventional successive approximation A/D converter 100R, the present inventor has come to recognize the following problem.

That is to say, with such a successive approximation A/D converter 100R, a DC bias current $I_{BIAS}$ flows through the bias power supply 112 regardless of the phase thereof even when both the bias switches SW41 and SW42 are turned off. This leads to unnecessary power loss.

SUMMARY OF THE INVENTION

The present invention has been made in order to solve such a problem. Accordingly, it is an exemplary purpose of an embodiment of the present invention to provide a successive approximation A/D converter with reduced power consumption.

An embodiment of the present invention relates to a successive approximation A/D converter. The successive approximation A/D converter comprises: a sample-and-hold circuit structured to sample and hold an input voltage; a D/A converter structured to generate an analog output voltage according to a digital input; a comparator circuit structured to compare an output voltage of the sample-and-hold circuit with the output voltage of the D/A converter; and a logic circuit structured to generate the digital input to be input to the D/A converter, based on an output of the comparator circuit. The sample-and-hold circuit comprises: a first capacitor having its first end coupled to a first node; a second capacitor having its first end coupled to the first node; a third capacitor having its first end coupled to a second node; a fourth capacitor having its first end coupled to the second node; a first switch arranged between a second end of the first capacitor and a high voltage terminal, and structured to turn on in a sampling phase; a second switch arranged between a second end of the second capacitor and a low voltage terminal, and structured to turn on in the sampling phase; a third switch arranged between a second end of the third capacitor and the high voltage terminal, and structured to turn on in the sampling phase; and a fourth switch arranged between a second end of the fourth capacitor and the low voltage terminal, and structured to turn on in the sampling phase. The comparator circuit comprises: a comparator having a first input and a second input; a fifth switch arranged between the second end of the first capacitor and the first input of the comparator, and structured to turn on in a comparison phase; a sixth switch arranged between the second end of the second capacitor and the first input of the comparator, and structured to turn on in the comparison phase; a seventh switch arranged between the second end of the third capacitor and the second input of the comparator, and structured to turn on in the comparison phase; and an eighth switch arranged between the second end of the fourth capacitor and the second input of the comparator, and structured to turn on in the comparison phase.

Such an embodiment does not require a bias power supply that continuously provides a DC current, thereby allowing power consumption to be reduced. Furthermore, such an arrangement is capable of setting and adjusting the bias point according to the capacitance ratio between the first capacitor and the second capacitor.

Also, in addition to the first capacitor and the second capacitor, the sample-and-hold circuit may further comprise an input switch arranged between the first node and an input terminal via which the input voltage is to be received, and structured to turn on in the sampling phase. Also, in the comparison phase, the output voltage of the D/A converter may be supplied to the first node.

Also, the successive approximation A/D converter may be structured to have a differential circuit configuration. Also, the D/A converter may comprise a first D/A converter and a second D/A converter. Also, in addition to the first capacitor through the fourth capacitor, the sample-and-hold circuit may further comprise: a first input switch arranged between the first node and a first input terminal via which one of a pair of differential input voltages is to be received, and structured to turn on in the sampling phase; and a second input switch arranged between the second node and the first input terminal via which one of a pair of differential input voltages is to be received, and structured to turn on in the sampling phase. Also, in the comparison phase, an output voltage of the first D/A converter may be supplied to the first node, and an output voltage of the second D/A converter may be supplied to the second node.

Also, the successive approximation A/D converter may be structured to have a differential circuit configuration. Also, the D/A converter may comprise a first D/A converter and a second D/A converter each configured as a capacitor array D/A converter. Also, the first D/A converter may comprise: a first capacitor array that corresponds to the first capacitor; and a second capacitor array that corresponds to the second capacitor. Also, the second D/A converter may comprise: a third capacitor array that corresponds to the third capacitor; and a fourth capacitor array that corresponds to the fourth capacitor.

Also, the successive approximation A/D converter may be monolithically integrated on a single semiconductor substrate. Examples of such a "monolithically integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants. By monolithically integrating the circuit on a single chip, such an arrangement allows the circuit area to be reduced, and allows the circuit elements to have uniform characteristics.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is coupled to the member B" includes a state in which the member A is indirectly coupled to the member B via another member that does not substantially affect the electric connection therebetween, or that does not damage the functions or effects of the connection therebetween, in addition to a state in which the member A is physically and directly coupled to the member B.

Similarly, the state represented by the phrase "the member C is provided between the member A and the member B" includes a state in which the member A is indirectly coupled to the member C, or the member B is indirectly coupled to the member C via another member that does not substantially affect the electric connection therebetween, or that does not damage the functions or effects of the connection therebetween, in addition to a state in which the member A is directly coupled to the member C, or the member B is directly coupled to the member C.

Figure 2:
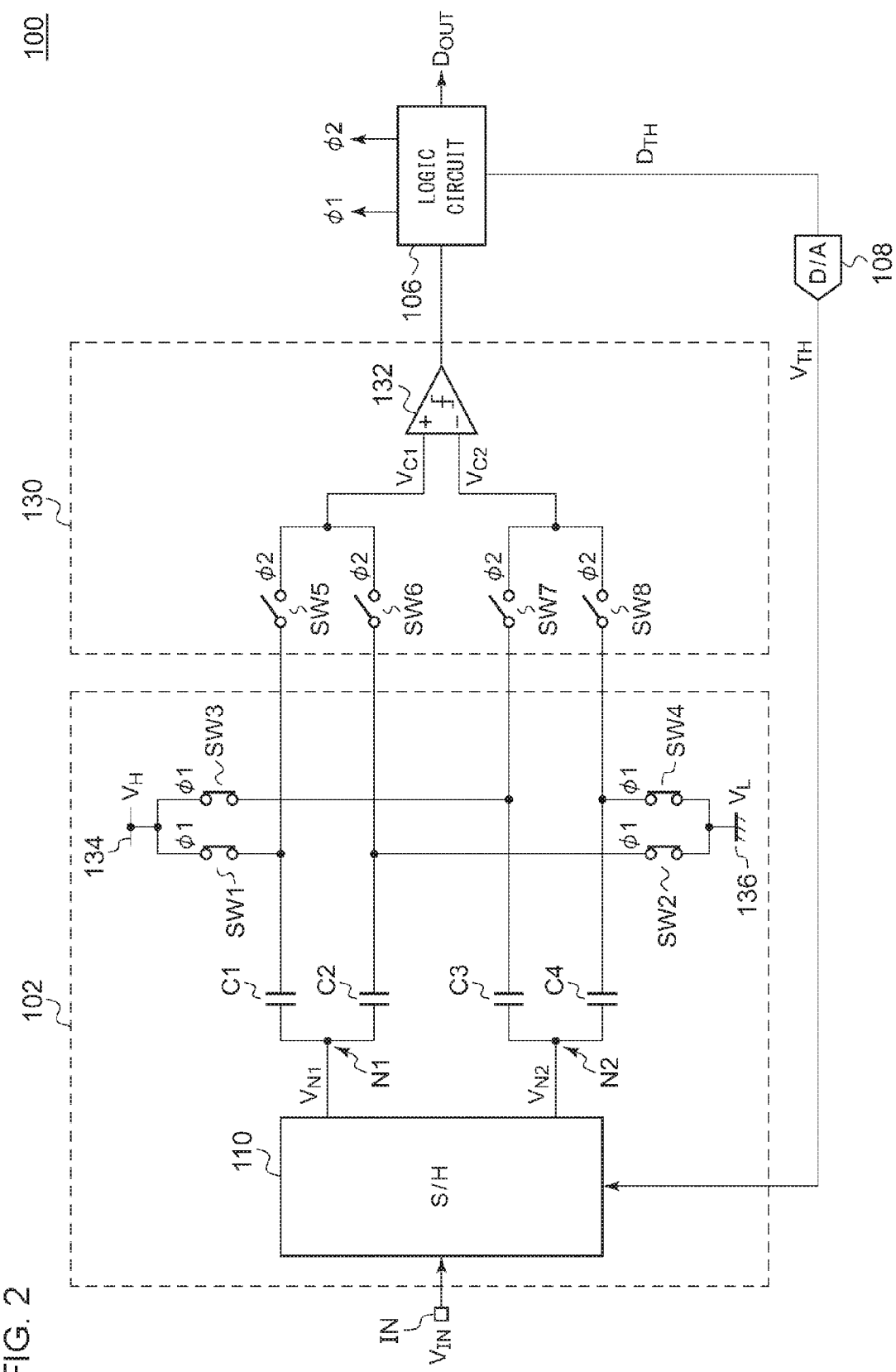
FIG. 2 is a block diagram showing a basic configuration of a successive approximation A/D converter according to an embodiment.

FIG. 2 is a block diagram showing a basic configuration of a successive approximation A/D converter 100 according to an embodiment. Preferably, the successive approximation A/D converter 100 is monolithically integrated on a single semiconductor substrate.

The successive approximation A/D converter 100 converts an analog input voltage $V_{IN}$ input to an input terminal IN into an output signal $D_{OUT}$ in the form of an N-bit digital signal (N represents an integer of 2 or more). Various kinds of circuit configurations are known in order to provide such a successive approximation A/D converter 100. That is to say, the circuit configuration of the successive approximation A/D converter 100 is not restricted in particular. For example, the successive approximation A/D converter 100 may have a single-ended circuit configuration or may have a differential circuit configuration.

The successive approximation A/D converter 100 includes a sample-and-hold circuit 102, a logic circuit 106, a D/A converter 108, and a comparator circuit 130. It should be noted that FIG. 2 is a schematic diagram showing a function configuration of the successive approximation A/D converter 100. The sample-and-hold circuit 102, the logic circuit 106, the D/A converter 108, and the comparator circuit 130 are not necessarily configured as separate hardware components. Also, a part of such components may be monolithically integrated as a single unit.

In the sampling phase $\phi 1$, the sample-and-hold circuit 102 samples the input voltage $V_{IN}$. In the subsequent comparison phase $\phi 2$, the input voltage $V_{IN}$ thus sampled is held. The D/A converter 108 generates an analog voltage $V_{TH}$ according to a digital input $D_{TH}$. The comparator circuit 130 has a function of comparing an output voltage of the sample-and-hold circuit 102 with an output voltage of the D/A converter 108.

The logic circuit 106 generates a clock for controlling the sampling phase $\phi 1$ and the comparison phase $\phi 2$. Furthermore, the logic circuit 106 generates the digital input $D_{TH}$, which is to be input to the D/A converter 108, based on the output of the comparator circuit 130. Moreover, the logic circuit 106 ultimately generates the output signal $D_{OUT}$ in the form of an N-bit digital signal, after a comparison operation is performed N times. The logic circuit 106 may have the same configuration as those according to conventional techniques.

The sample-and-hold circuit 102 includes a first capacitor C1 through a fourth capacitor C4, a first switch SW1 through a fourth switch SW4, and an input switch circuit 110.

The first ends of the first capacitor C1 and the second capacitor C2 are each coupled to a common first node N1. The first ends of the third capacitor C3 and the fourth capacitor C4 are each coupled to a common second node N2. Description will be made below with the voltage at the first node N1 as $V_{N1}$ and with the voltage at the second node N2 as $V_{N2}$. Various kinds of circuit configurations may be employed for the input switch circuit 110, as described later. A change occurs in both of, or otherwise in either of, the two voltages $V_{N1}$ and $V_{N2}$ according to the input voltage $V_{IN}$ and the output voltage $V_{TH}$ of the D/A converter 108.

The first switch SW1 is arranged between the second end of the first capacitor C1 and the high voltage terminal (or line) 134. A predetermined high-level voltage $V_H$ is supplied to the high voltage terminal 134. The high-level voltage $V_H$ is configured as a power supply voltage or otherwise a predetermined reference voltage. The second switch SW2 is arranged between the second end of the second capacitor C2 and the low voltage terminal 136.

The third switch SW3 is arranged between the second end of the third capacitor C3 and the high voltage terminal 134. The fourth switch SW4 is arranged between the second end of the fourth capacitor C4 and the low voltage terminal 136. During the sampling phase φ1, the first switch SW1 through the fourth switch SW4 are turned on.

Figure 1:
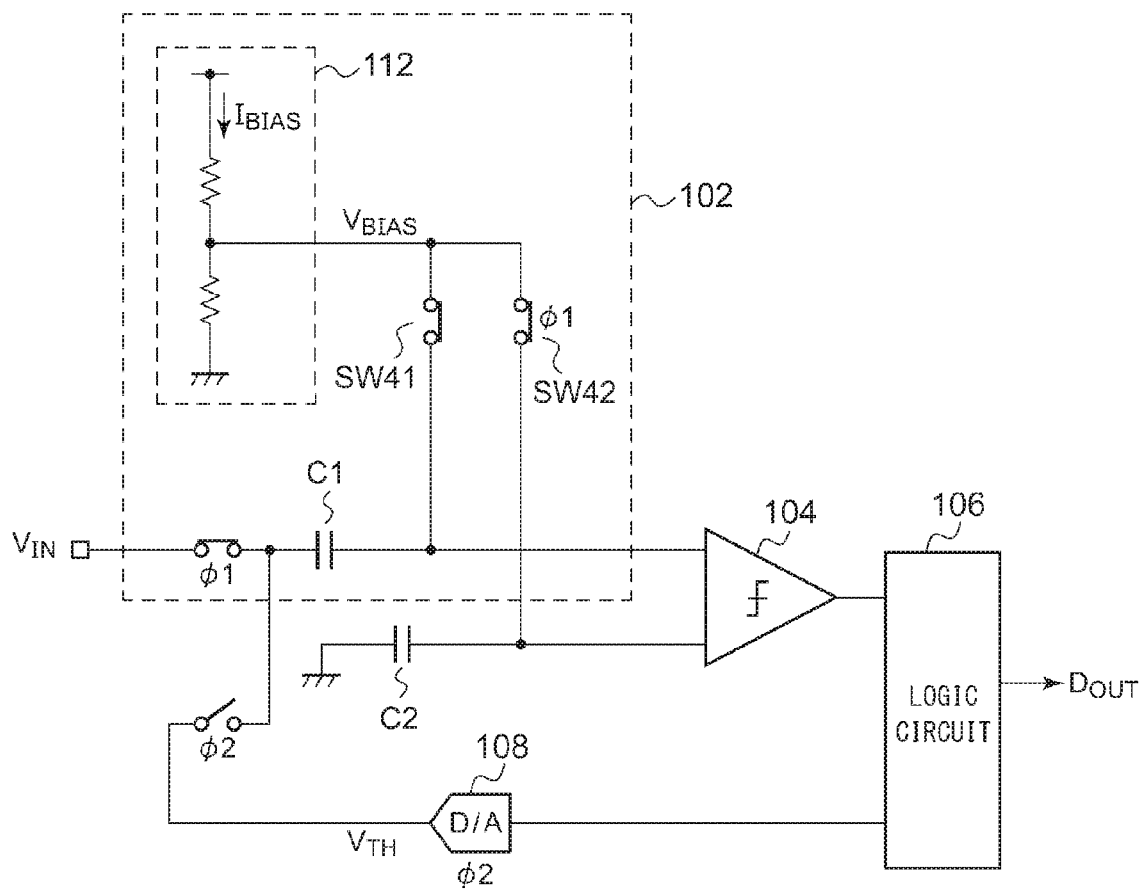
FIG. 1 is a circuit diagram showing a successive approximation A/D converter.

The successive approximation A/D converter 100 shown in FIG. 2 is provided with the comparator circuit 130 instead of the comparator 104 shown in FIG. 1. The comparator circuit 130 includes a comparator 132, and a fifth switch SW5 through an eighth switch SW8. The comparator 132 includes a first input (e.g., non-inverting input terminal+) and a second input (e.g., inverting input terminal−).

The fifth switch SW5 is arranged between the second end of the first capacitor C1 and the first input of the comparator 132. The sixth switch SW6 is arranged between the second end of the second capacitor C2 and the first input of the comparator 132. The seventh switch SW7 is arranged between the second end of the third capacitor C3 and the second input of the comparator 132. The eighth switch SW8 is arranged between the second end of the fourth capacitor and the second input of the comparator 132. During the comparison phase φ2, the fifth switch SW5 through the eighth switch SW8 are turned on.

The above is the configuration of the successive approximation A/D converter 100. Next, description will be made regarding the operation thereof.

Description will be made directing attention to the first node N1 side. The first switch SW1 and the second switch SW2 are turned on during the first phase φ1. In this phase, the first capacitor C1 is charged using the voltage difference between the voltage $V_{N1}$ at the first node N1 and the high voltage $V_H$. Furthermore, the second capacitor C2 is charged using the voltage difference between the voltage $V_{N1}$ at the first node N1 and the low voltage $V_L$. The amounts of charge Q1 and Q2 stored in the first capacitor C1 and the second capacitor C2 are represented by the following Expressions (1) and (2), respectively.

$$Q1 = C1 \times (V_H - V_{N1}) \quad (1)$$

$$Q2 = C2 \times (V_L - V_{N1}) \quad (2)$$

After the sampling operation ends, the operation state enters the hold state. In the hold state, the first switch SW1 through the fourth switch SW4 are turned off.

In the subsequent comparison phase φ2, the fifth switch SW5 and the sixth switch SW6 are turned on. In this phase, charge migration (charge redistribution) occurs between the first capacitor C1 and the second capacitor C2. After the charge redistribution, the amount of charge Q1' stored in the capacitor C1 and the amount of charge Q2' stored in the capacitor C2 are respectively represented by the following Expressions (3) and (4) using the electric potential $V_{C1}$ at the first input (+).

$$Q1' = C1 \times (V_{C1} - V_{N1}) \quad (3)$$

$$Q2' = C2 \times (V_{C1} - V_{N1}) \quad (4)$$

The first input of the comparator 132 has a sufficiently high impedance, which allows the overall amount of charge Q1+Q2 before and after the charge migration to be conserved.

$$Q1 + Q2 = Q1' + Q2' \quad (5)$$

Accordingly, the voltage $V_{C1}$ after the charge redistribution is represented by the following Expression (6).

$$V_{C1} = (C1 \times V_H + C2 \times V_L)/(C1 + C2) \quad (6)$$

Similarly, on the second node N2 side, the voltage $V_{C2}$ after the charge redistribution is represented by the following Expression (7).

$$V_{C2} = (C3 \times V_H + C4 \times V_L)/(C3 + C4) = (C1 \times V_H + C2 \times V_L)/(C1 + C2) \quad (7)$$

where, C1=C3, C2=C4.

The sample-and-hold circuit 102, the logic circuit 106, and the D/A converter 108 operate in the same way as those of the conventional successive approximation A/D converter 100R. With such an arrangement, the successive approximation A/D converter 100 performs successive approximation such that the output voltage $V_{TH}$ of the D/A converter 108 approaches the voltage $V_{C1}$ in the Expression (6) (i.e., $V_{C2}$ in the Expression (7)).

The above is the operation of the successive approximation A/D converter 100.

With the successive approximation A/D converter 100, as can clearly be understood from the Expressions (6) and (7), such an arrangement allows the bias voltages $V_{C1}$ and $V_{C2}$ to be respectively generated at the first input and the second input of the comparator 132.

One of the marked advantages of the comparator circuit 130 is that that the pair of inputs of the comparator 132 can each be biased to a desired voltage without involving a steady bias current. That is to say, such an arrangement requires a flow of current from the high voltage terminal 134 in only a short period of time required to charge the sampling capacitors C1 through C4 immediately after the transition to the sampling phase φ1 in which the first switch SW1 and the third switch SW3 are turned on. Thus, such an arrangement allows the power consumption to be dramatically reduced as compared with conventional circuits that require a steady flow of such a bias current regardless of the operation phase.

Furthermore, the bias voltages applied to the pair of inputs of the comparator 132 are equal to each other, and are equally represented by $(C1 \times V_H + C2 \times V_L)/(C1 + C2)$. That is to say, such an arrangement is capable of adjusting the bias shift amount according to the capacitance ratio between the capacitor C1 and the capacitor C2. For example, in a case in which C1=C2, such an arrangement allows the pair of inputs of the comparator 132 to be biased to a midpoint between the high voltage $V_H$ and the low voltage $V_L$. In a case in which C1>C2, such an arrangement allows the pair of inputs of the comparator 132 to be biased to a voltage that is higher than the midpoint between them. Conversely, in a case in which C1<C2, such an arrangement allows the pair of inputs of the comparator 132 to be biased to a voltage that is lower than the midpoint between them.

The present invention encompasses various kinds of apparatuses and circuits that can be regarded as a block configuration or a circuit configuration shown in FIG. 2, or otherwise that can be derived from the aforementioned description. That is to say, the present invention is not restricted to a specific configuration. More specific description will be made below regarding an example configuration for clarification and ease of understanding of the essence of the present invention and the circuit operation. That is to say, the following description will by no means be intended to restrict the technical scope of the present invention.

First Embodiment

Figure 3:
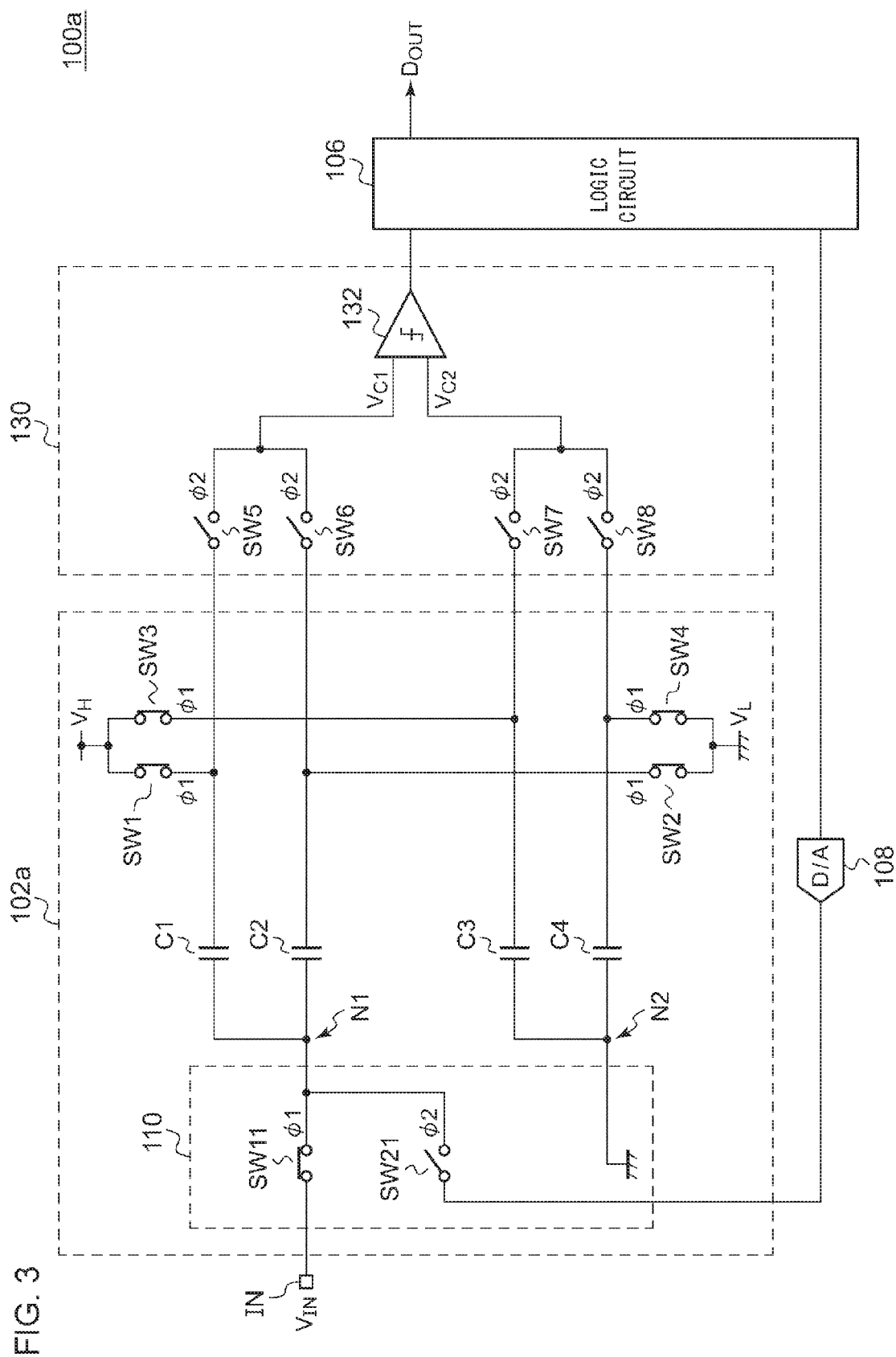
FIG. 3 is a circuit diagram showing a successive approximation A/D converter according to a first embodiment.

FIG. 3 is a circuit diagram showing a successive approximation A/D converter 100a according to a first embodiment. The successive approximation A/D converter 100a has a single-ended circuit configuration. An input switch circuit 110a of a sample-and-hold circuit 102a includes a first input switch SW11 and a first hold switch SW21. The first input switch SW11 is arranged between an input terminal IN and a first node N1 configured as a common connection node that connects a first capacitor C1 and a second capacitor C2.

The first hold switch SW21 is arranged between the first node N1 and the output terminal of the D/A converter 108. In the sampling phase φ1, the first input switch SW11 is turned on. In this phase, the first capacitor C1 is charged by the voltage difference between the input voltage $V_{IN}$ and the high-level voltage $V_H$. The second capacitor C2 is charged by the voltage difference between the input voltage $V_{IN}$ and the low-level voltage $V_L$. In the comparison phase φ2, the first hold switch SW21 is turned on. In this phase, the output voltage $V_{TH}$ of the D/A converter 108 is supplied to the first node N1.

The second node N2 is grounded such that its electric potential is set to a fixed value. Accordingly, in the sampling phase φ1, the third capacitor C3 is charged by the high-level voltage $V_H$, and the fourth capacitor C4 is charged by the low-level voltage $V_L$.

Second Embodiment

Figure 4:
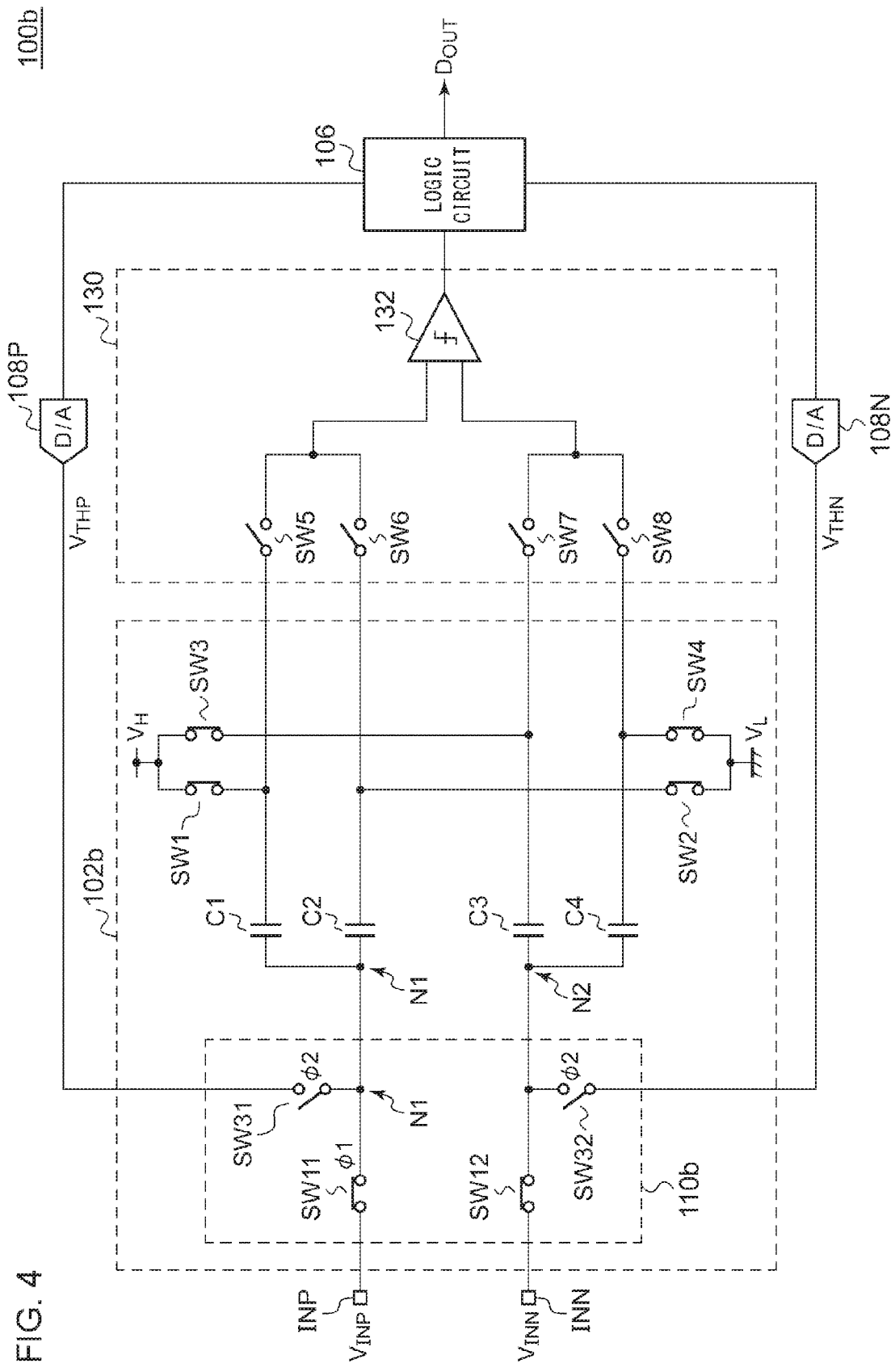
FIG. 4 is a circuit diagram showing a successive approximation A/D converter according to a second embodiment.

FIG. 4 is a circuit diagram showing a successive approximation A/D converter 100b according to a second embodiment. The successive approximation A/D converter 100b has the same configuration as that of the successive approximation A/D converter 100a shown in FIG. 3 except that the successive approximation A/D converter 100b has a differential circuit configuration.

A pair of differential input voltages $V_{INP}$ and $V_{INN}$ are input to a pair of input terminals (INP, INN), respectively. The first input switch SW11 is arranged between the INP terminal and the first node N1. The second input switch SW12 is arranged between the INN terminal and the second node N2. In the sampling phase φ1, the first input switch SW11 and the second input switch SW12 are turned on.

The first hold switch SW21 is arranged between the first node N1 and the ground. The second hold switch SW22 is arranged between the second node N2 and the ground. After the sampling operation ends, the first hold switch SW21 and the second hold switch SW22 are turned on, which holds the input voltages $V_{INN}$ and $V_{INP}$ in the form of voltage differences across the capacitors C1 through C4. Specifically, the capacitors C1 through C4 are charged by the voltage differences $(V_{INP}-V_H)$, $(V_{INP}-V_L)$, $(V_{INN}-V_H)$, and $(V_{INN}-V_L)$, respectively.

The D/A converter 108 includes a first D/A converter 108P and a second D/A converter 108N. Such a pair of the first D/A converter 108P and the second D/A converter 108N generate a pair of differential threshold voltages $V_{THP}$ and $V_{THN}$.

An input switch circuit 110b further includes switches SW31 and SW32 configured to turn on in the comparison phase φ2, in addition to the first input switch SW11 and the second input switch SW12. The differential threshold voltages $V_{THP}$ nd $V_{THN}$ are supplied to the first node N1 and the second node N2 via the switches SW31 and SW32, respectively.

Third Embodiment

Figure 5:
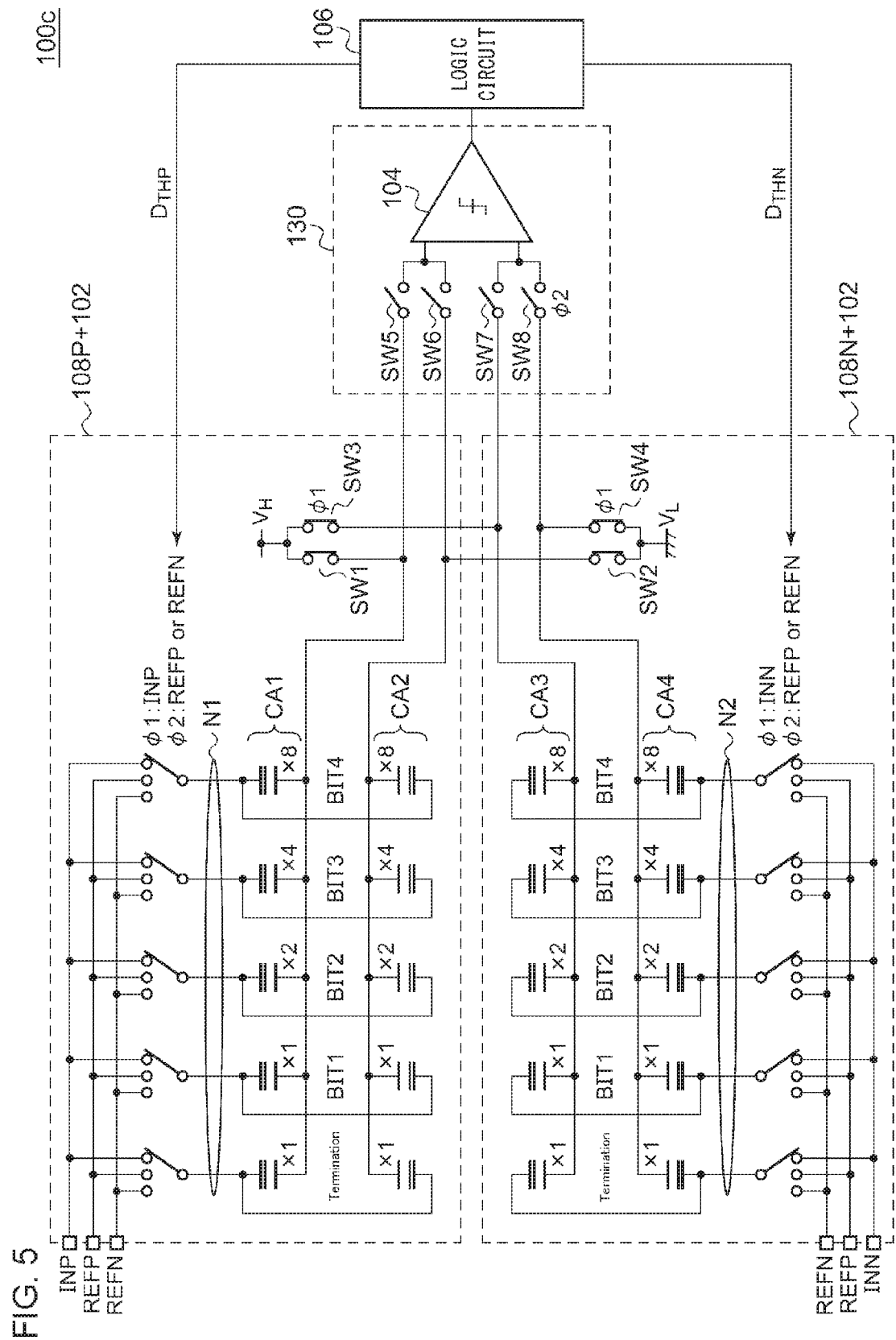
FIG. 5 is a circuit diagram showing a successive approximation A/D converter according to a third embodiment.

FIG. 5 is a circuit diagram showing a successive approximation A/D converter 100c according to a third embodiment. The successive approximation A/D converter 100c has the same configuration as that of successive approximation A/D converter 100b shown in FIG. 4 except that the successive approximation A/D converter 100c includes the D/A converters 108P and 108N having a capacitor array configuration, and is monolithically integrated together with the sample-and-hold circuit 102.

Conventional capacitor array D/A converters include a combination of a capacitor array and switches. In contrast, a first D/A converter 108P according to the third embodiment has the same basic mechanism and the same configuration as those according to conventional techniques except that the first D/A converter 108P is provided with a first capacitor array CA1 that corresponds to the first capacitor C1 and a second capacitor array CA2 that corresponds to the second capacitor C2. The capacitors that form the first capacitor array CA1 are each configured to have a binary-weighted capacitance. Similarly, the capacitors that form the second capacitor array CA2 are each configured to have a binary-weighted capacitance. The second D/A converter 108N has the same configuration. That is to say, the second D/A converter 108N is provided with a third capacitor array CA3 that corresponds to the third capacitor C3 and a fourth capacitor array CA4 that corresponds to the fourth capacitor C4.

With the third embodiment, such an arrangement is capable of setting a bias point according to the ratio between the basic capacitance of the first capacitor array CA1 and the basic capacitance of the second capacitor array CA2 and the ratio between the basic capacitance of the third capacitor array CA3 and the basic capacitance of the fourth capacitor array CA4.

Description has been made above regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

The aforementioned embodiments have been described for exemplary purposes only. That is to say, the present invention is also applicable to various other kinds of successive approximation A/D converters.

While the preferred embodiments of the present invention have been described using specific terms, such description is for illustrative purposes only, and it is to be understood that changes and variations may be made without departing from the spirit or scope of the appended claims.

What is claimed is:

1. A successive approximation A/D converter comprising:
   a sample-and-hold circuit structured to sample and hold an input voltage;
   a D/A converter structured to generate an analog output voltage according to a digital input;
   a comparator circuit structured to compare an output voltage of the sample-and-hold circuit with the output voltage of the D/A converter; and
   a logic circuit structured to generate the digital input to be input to the D/A converter, based on an output of the comparator circuit,
   wherein the sample-and-hold circuit comprises:
      a first capacitor having its first end coupled to a first node;
      a second capacitor having its first end coupled to the first node;
      a third capacitor having its first end coupled to a second node;
      a fourth capacitor having its first end coupled to the second node;
      a first switch arranged between a second end of the first capacitor and a high voltage terminal, and structured to turn on in a sampling phase;
      a second switch arranged between a second end of the second capacitor and a low voltage terminal, and structured to turn on in the sampling phase;
      a third switch arranged between a second end of the third capacitor and the high voltage terminal, and structured to turn on in the sampling phase; and
      a fourth switch arranged between a second end of the fourth capacitor and the low voltage terminal, and structured to turn on in the sampling phase,
   and wherein the comparator circuit comprises:
      a comparator having its first input and its second input;
      a fifth switch arranged between the second end of the first capacitor and the first input of the comparator, and structured to turn on in a comparison phase;
      a sixth switch arranged between the second end of the second capacitor and the first input of the comparator, and structured to turn on in the comparison phase;
      a seventh switch arranged between the second end of the third capacitor and the second input of the comparator, and structured to turn on in the comparison phase; and
      an eighth switch arranged between the second end of the fourth capacitor and the second input of the comparator, and structured to turn on in the comparison phase.

2. The successive approximation A/D converter according to claim 1, wherein the sample-and-hold circuit further comprises an input switch arranged between the first node and an input terminal via which the input voltage is to be received, and structured to turn on in the sampling phase,
   and wherein, in the comparison phase, the output voltage of the D/A converter is supplied to the first node.

3. The successive approximation A/D converter according to claim 1, structured to have a differential circuit configuration, wherein the D/A converter comprises a first D/A converter and a second D/A converter,
   wherein the sample-and-hold circuit further comprises:
      a first input switch arranged between the first node and a first input terminal via which one of a pair of differential input voltages is to be received, and structured to turn on in the sampling phase; and
      a second input switch arranged between the second node and the first input terminal via which one of a pair of differential input voltages is to be received, and structured to turn on in the sampling phase,
   and wherein, in the comparison phase, an output voltage of the first D/A converter is supplied to the first node, and an output voltage of the second D/A converter is supplied to the second node.

4. The successive approximation A/D converter according to claim 1, structured to have a differential circuit configuration, wherein the D/A converter comprises a first D/A converter and a second D/A converter each configured as a capacitor array D/A converter,
   wherein the first D/A converter comprises:
      a first capacitor array that corresponds to the first capacitor; and
      a second capacitor array that corresponds to the second capacitor,
   and wherein the second D/A converter comprises:
      a third capacitor array that corresponds to the third capacitor; and
      a fourth capacitor array that corresponds to the fourth capacitor.

5. The successive approximation A/D converter according to claim 1, monolithically integrated on a single semiconductor substrate.

* * * * *